US008666701B2

(12) United States Patent
Motz

(10) Patent No.: US 8,666,701 B2
(45) Date of Patent: Mar. 4, 2014

(54) ACCURATE AND COST EFFICIENT LINEAR HALL SENSOR WITH DIGITAL OUTPUT

(75) Inventor: Mario Motz, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 380 days.

(21) Appl. No.: 13/050,286

(22) Filed: Mar. 17, 2011

(65) Prior Publication Data

US 2012/0239350 A1    Sep. 20, 2012

(51) Int. Cl.
*G06F 15/00*    (2006.01)

(52) U.S. Cl.
USPC .......... 702/190; 324/207.13; 324/207.25; 324/251; 324/76.77; 340/572.1; 340/572.4; 340/505

(58) Field of Classification Search
USPC .......... 702/190; 324/207.13, 207.25, 251, 324/76.77; 340/572.1, 572.4, 505; 341/110, 341/144, 155
See application file for complete search history.

(56) References Cited

U.S. PATENT DOCUMENTS

| | | | |
|---|---|---|---|
| 4,754,220 A | 6/1988 | Shimizu et al. | |
| 5,619,134 A | 4/1997 | Watanabe et al. | |
| 6,636,035 B2 | 10/2003 | Kiriyama et al. | |
| 6,727,689 B1 | 4/2004 | Furlong et al. | |
| 6,812,839 B1* | 11/2004 | Belcher et al. | 340/572.1 |
| 8,063,629 B2* | 11/2011 | Hackner et al. | 324/207.25 |
| 8,203,471 B2* | 6/2012 | Motz et al. | 341/110 |
| 2004/0203361 A1* | 10/2004 | Belcher et al. | 455/41.2 |
| 2009/0315549 A1* | 12/2009 | Hackner et al. | 324/251 |
| 2010/0052665 A1* | 3/2010 | Van Den Homberg et al. | 324/228 |
| 2011/0133723 A1* | 6/2011 | Forsyth et al. | 324/207.2 |
| 2011/0215955 A1* | 9/2011 | Motz et al. | 341/110 |
| 2012/0182658 A1* | 7/2012 | Motz | 361/91.5 |
| 2012/0262317 A1* | 10/2012 | Motz et al. | 341/110 |

FOREIGN PATENT DOCUMENTS

| | | |
|---|---|---|
| DE | 102004002718 A1 | 11/2004 |
| DE | 102008047109 A1 | 5/2009 |
| DE | 102008063782 A1 | 7/2010 |

OTHER PUBLICATIONS

"TLE 4941plusC: Differential Hall IC for Wheel Speed Sensing", www.infineon.com/sensors, Oct. 2010, p. 1-2.
"Differential Two-Wire Hall Effect Sensor IC", TLE 4941—TLE 4941C Data Sheet, Apr. 2001, p. 1-10.
"AS5510: Linear Hall Sensor with I2C Output", Revision 1-25, www.austriamicrosystems.com, 2010, p. 1-16.

(Continued)

Primary Examiner — Carol S Tsai
(74) Attorney, Agent, or Firm — Eschweiler & Associates, LLC

(57) ABSTRACT

One embodiment of the present invention relates to a magnetic sensor circuit having a magnetic field sensor device configured to generate a digital signal proportional to an applied magnetic field. An analog-to-digital converter converts the analog signal to a digital signal that is provided to a digital signal processing unit, which is configured to digitally track the analog output signal. The digital tracking unit comprises a delay removal circuitry configured to generate a plurality of digital signal component corresponding to a chopping phase. A non-delayed offset compensated digital output signal may be generated within the chopping phase by mathematically operating upon (e.g., adding or subtracting) the plurality of digital signal components, generated by the delay removal circuitry.

21 Claims, 9 Drawing Sheets

(56) References Cited

OTHER PUBLICATIONS

"AS5510: Linear Hall Sensor with I2C Output", Revision 1-24, www.austriamicrosystems.com, 2010, p. 1-16.
"Low Power Hall Switch", TLE 4913 V2.2, Mar. 9, 2004, p. 1-12.
"An Integrated Magnetic Sensor with Two Continuous-Time Converters and Stress Compensation Capability." 2006 IEEE International Solid-State Circuits Conference. pp. 18-20.
"A CMOS Single-Chip Electronic Compass with Microcontroller." 2007 IEEE International Solid State-Circuit Conference. pp. 382, 383, and 609.
"TLE4998C3C: Programmable Linear Hall Sensor." Sep. 2009. pp. 1-42.
"MLX90316 Rotary Position Sensor IC." May 2009. pp. 1-42.
U.S. Appl. No. 13/006,654, filed Jan. 14, 2011. 28 Pages.
Office Action dated Sep. 13, 2013 for U.S. Appl. No. 13/006,654.

* cited by examiner

US 8,666,701 B2

ACCURATE AND COST EFFICIENT LINEAR HALL SENSOR WITH DIGITAL OUTPUT

BACKGROUND OF THE INVENTION

Hall effect devices are solid state electron devices that operate in response to a magnetic field based upon the Hall effect principle, a phenomenon by which a voltage differential is generated across an electrically conducting body in the presence of a magnetic field. Conventional Hall effect devices typically comprise a planar structure, known as a Hall plate, which is configured to generate an output signal (e.g., either voltage or current) that is proportional to an applied magnetic field. Hall plates may be configured parallel to the surface of a substrate (lateral Hall plates) or perpendicular to the surface of a substrate (vertical Hall plates).

The integration of Hall effect devices (e.g., Hall plates) into semiconductor bodies (e.g., silicon substrate) has become common in many applications. One main problem of Hall effect devices is zero point offset errors, which is a non-zero output signal (e.g., voltage, current) provided by the Hall effect device in the absence of a magnetic field (i.e., magnetic field equal to zero). The offset errors of a Hall effect device may be caused by small asymmetries of the device caused by manufacturing tolerances or mechanical stress or thermoelectric voltages. In order to reduce/remove the offset errors experienced by a Hall effect device, the Hall effect device may be configured to take readings along different orientations of the device. Such methods, known as "current spinning", send current through a Hall effect device in different directions and combine the output signals in a manner which reduces the offset. For example, a square Hall plate may be rotated by 90° between measurements and then the average of the Hall output signals, over a spinning cycle, may be taken. While current spinning methods may reduce the offset errors, such methods alone fail to completely remove offset errors.

BRIEF DESCRIPTION OF THE DRAWINGS

FIG. 1b illustrates signal diagrams corresponding to the magnetic sensor circuit of FIG. 1a.

FIG. 5b illustrates a more detailed embodiment of the plurality of registers, shown in the magnetic sensor circuit of FIG. 5a.

FIG. 5c illustrates an alternative embodiment of the plurality of registers, shown in the magnetic sensor circuit of FIG. 5a.

FIG. 5d illustrates another alternative embodiment of the plurality of registers, shown in the magnetic sensor circuit of FIG. 5a.

FIG. 6b illustrates signal diagrams corresponding to the magnetic sensor circuit of FIG. 6a.

DETAILED DESCRIPTION OF THE INVENTION

Figure 1A:
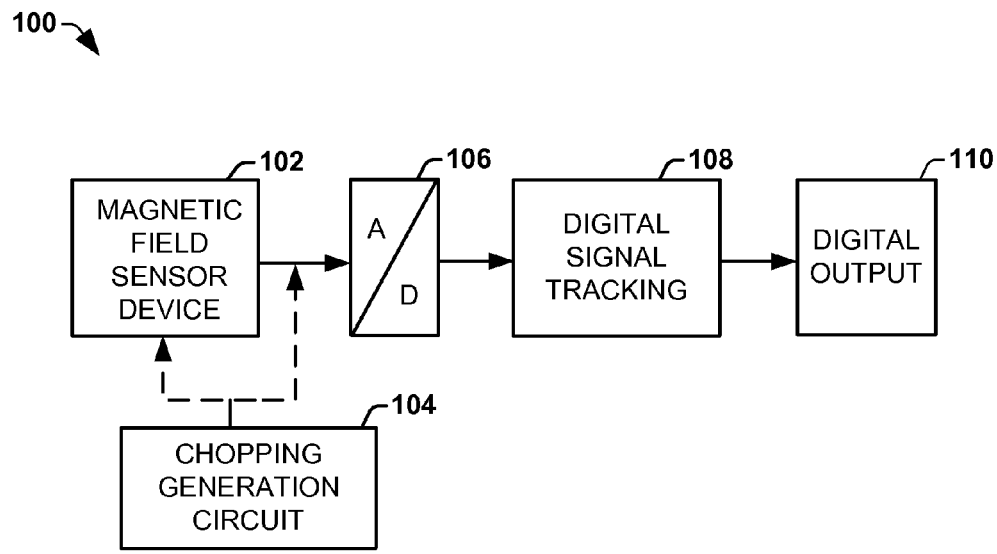
FIG. 1a illustrates a magnetic sensor circuit configured to generate an offset compensated output signal proportional to the output of a magnetic field sensor.

The present invention will now be described with reference to the attached drawing figures, wherein like reference numerals are used to refer to like elements throughout, and wherein the illustrated structures and devices are not necessarily drawn to scale.

Some aspects of the present disclosure provide for a magnetic sensor circuit comprising a digital signal processing unit configured to efficiently track the output of a magnetic field sensor device. In one embodiment, the method and apparatus comprise a magnetic sensor circuit having a magnetic field sensor device configured to generate an analog signal proportional to an applied magnetic field. An analog-to-digital converter converts the analog signal to a digital signal that is provided to a digital signal processing unit, which is configured to digitally track the analog signal. The digital tracking unit comprises a delay removal circuitry configured to generate a plurality of digital signal component corresponding to a chopping phase. A non-delayed offset compensated digital output signal may be generated within the chopping phase by mathematically operating upon (e.g., adding or subtracting) the plurality of digital signal components, generated by the delay removal circuitry, thereby providing high performance digital tracking.

It will be appreciated that the method and apparatus provided herein are not limited to a particular type of magnetic field sensor device, but instead may be applied to a magnetic sensor circuit comprising any magnetic field sensor device that experience a zero point offset error. For example, in some embodiments, the method and apparatus provided herein may be applied to the magnetic sensor circuits comprising magnetic field sensor devices such as Hall effect devices, flipping anisotropic magnetoresistance (AMR) magnetic field sensors, etc.

Referring to FIG. 1a, the inventor has appreciated that a magnetic sensor circuit 100 may be configured to generate a digital output signal in response to an analog signal corresponding to a magnetic field detected by a magnetic field sensor device 102. The analog signal is provided from the magnetic field sensor device 102 to an analog-to-digital converter (ADC) 106 that converts the analog signal to a digital signal that is subsequently tracked by a digital signal processing unit 108 (e.g., using step-by-step tracking, adaptive tracking at high signal slopes, etc.). Although shown herein as a separate element, in various embodiments the ADC 106 or its functional equivalent may be a part of the digital signal processing unit 108.

To remove zero point offset from the tracked digital signal, a chopping generation circuit 104 is configured to periodically switch the polarity of components of the analog signal (e.g., switched during different chopping phases) to generate a chopped signal. The digital signal processing unit 108 can add or subtract chopped digital signals to generate a digital output signal, having a removed/reduced offset value, which is provided to digital output 110.

Figure 1B:
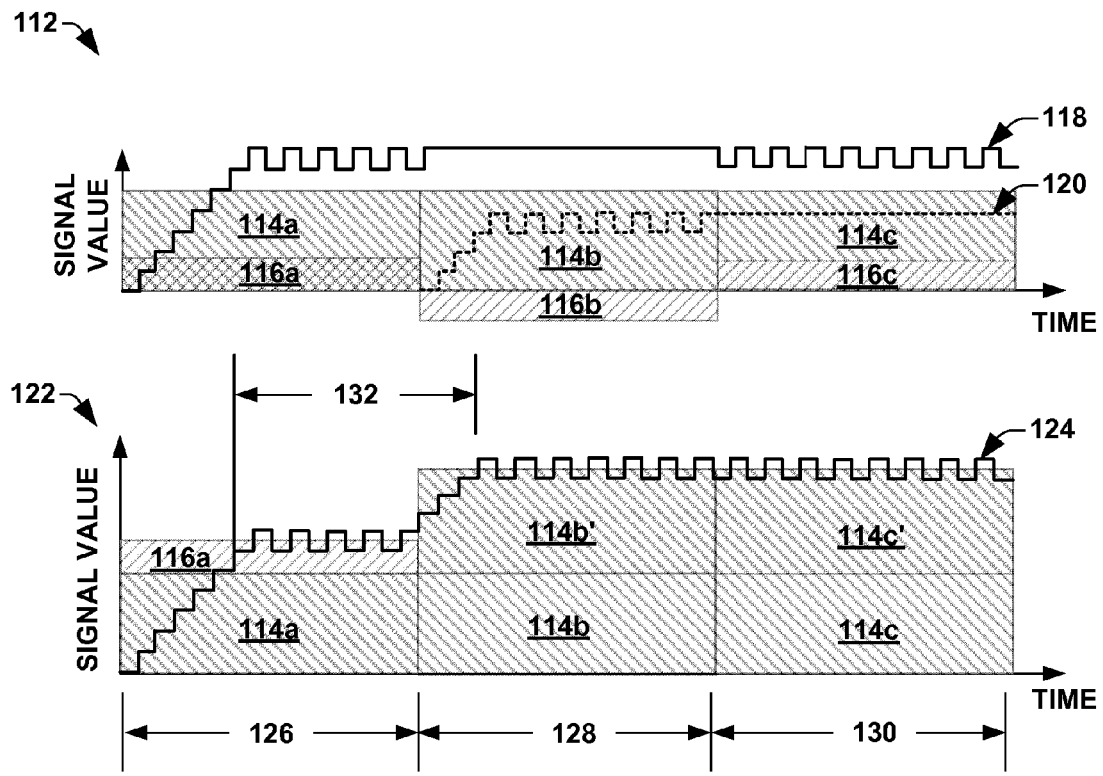

For example, FIG. 1b illustrates signal diagrams corresponding to the magnetic sensor circuit of FIG. 1a, particularly illustrating chopping of a digital signal that tracks the analog signal output from magnetic field sensor device 102. As shown in graph 112, during a first chopping phase 126, a positive base signal component 114a having a positive offset signal component 116a is tracked as a digital signal 118 (having a larger absolute magnitude than the positive base signal component 114a, since the offset signal component 116a is the same sign as the base signal component 114a). During a second chopping phase 128, a positive base signal component 114b having a negative offset signal component 116b is tracked as a digital signal 120 (having a smaller absolute magnitude than the positive base signal component 114b, since the offset signal component 116b is the opposite sign as the base signal component 114b), while digital signal 118 is held constant.

Graph 122 illustrates a summation of digital signals 118 and 120. Because the offsets of the digital signals 118 and 120 have opposite signs during and after the second chopping phase 128, the summation of digital signals 118 and 120 causes the offsets to cancel, resulting in a digital signal 124 that has two times the signal amplitude but no offset. However, as illustrated in graph 122, such summation of the digital signals requires a relatively long delay time 132 for the signals to achieve the offset cancelled digital value, since the delay time relies upon chopping to generate digital signal 120, having an offset that is opposite that of digital signal 118, in the second chopping phase 128. The delay time 132 used by the chopping technique ("chopper delay") may result in the digital output signal containing distortions for high speed applications (e.g., digitally tracked sinusoidal signals may have sharp edges in the signal).

Figure 2:
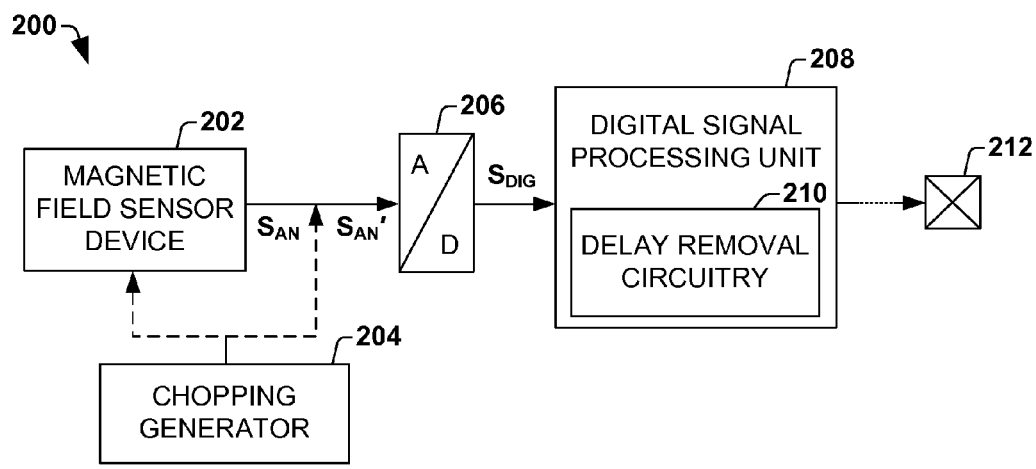
FIG. 2 illustrates a block diagram of a first embodiment of a magnetic sensor circuit configured to generate a non-delayed, offset compensated output signal that tracks an analog signal output from a magnetic field sensor.

FIG. 2 illustrates a first embodiment of a magnetic sensor circuit 200 configured to generate a non-delayed, offset compensated digital output signal that tracks an analog signal output from a magnetic field sensor device. As shown in FIG. 2, a magnetic field sensor device 202 is configured to detect an applied magnetic field and to output an analog signal $S_{AN}$ proportional to the magnitude of the applied magnetic field. The analog signal $S_{AN}$ may comprise a base signal component and an offset signal component (i.e., a zero point offset error). In various embodiments, the magnetic field sensor device 202 may comprise a Hall effect magnetic field sensor, an anisotropic magnetoresistance (AMR) magnetic field sensor, a giant magnetoresistance (GMR) magnetic field sensors, etc., for example.

The analog signal $S_{AN}$ is output to an analog-to-digital converter (ADC) 206, configured to convert the analog signal $S_{AN}$ to a digital signal $S_{DIG}$. A chopping generation circuit 204 may be configured to "chop" the analog signal output from the magnetic field sensor device 202 by periodically changing the polarity of components of the analog signal that is provided to the ADC 206. For example, in one embodiment, during a first chopping phase the chopping generation circuit 204 is configured to provide an analog signal having a positive base signal component and a positive offset component to the ADC 206. During a second chopping phase, the chopping generation circuit 204 is configured to provide an analog signal having a negative base signal component and a positive offset component to the ADC 206. By alternating the polarity of the analog signal $S_{AN}$ output from the magnetic field sensor device 202 a chopped signal $S_{AN}'$ is generated.

The digital signal $S_{DIG}$ is provided from the ADC 206 to a digital signal processing unit 208. As stated above, the digital signal processing unit may comprise the ADC 206 or a functional equivalent thereof. The digital signal processing unit 208 is configured to track the value of the analog signal output from the magnetic field sensor device 202 as a digital signal (e.g., to generate a digital signal corresponding to a sensed magnetic field) and to provide the tracked digital signal to an output node 212.

The digital signal processing unit 208 comprises a delay removal circuitry 210 having one or more delay removal elements configured to reduce the amount of time it takes for the tracked digital signal to achieve a digital equivalent of the analog signal (e.g., to achieve a digital equivalent of the analog signal within a single chopping phase). More particularly, the delay removal circuitry 210 may be configured to generate a plurality of digital signal components, formed from the digital signal output by the ADC 206 and corresponding to a chopping phase, which may be operated upon to generate a digitally tracked signal that efficiently achieves a digital equivalent of the analog signal (e.g., substantially achieves an offset compensated value of the analog output signal within a single chopping phase).

For example, in one embodiment the delay removal circuitry 210 may be configured to provide first and second digital signal components. The first digital signal component may comprise the digital signal output from the ADC 206 during a first chopping phase, while the second digital signal component may comprise a modification of the digital signal output from the ADC 206 during the first chopping phase. The two digital signal components can be mathematically operated upon (e.g., added, subtracted) to generate a digitally output signal that achieves the value of the analog signal $S_{AN}$ in a short time (e.g., almost immediately).

Therefore, in contrast to the magnetic sensor circuit of FIGS. 1a and 1b, which relies upon the generation of a digital signal in consecutive chopping phases, the delay removal circuitry 210 of FIG. 2 adds digital signal components generated during a same chopping phase. Because digital signal components from a same chopping phase are mathematically operated upon to form the digital output signal, the delay present in the magnetic sensor circuit of FIG. 1a (which does not achieve a digital equivalent of the analog signal until the later of the consecutive chopping phases) is removed.

Figure 3:
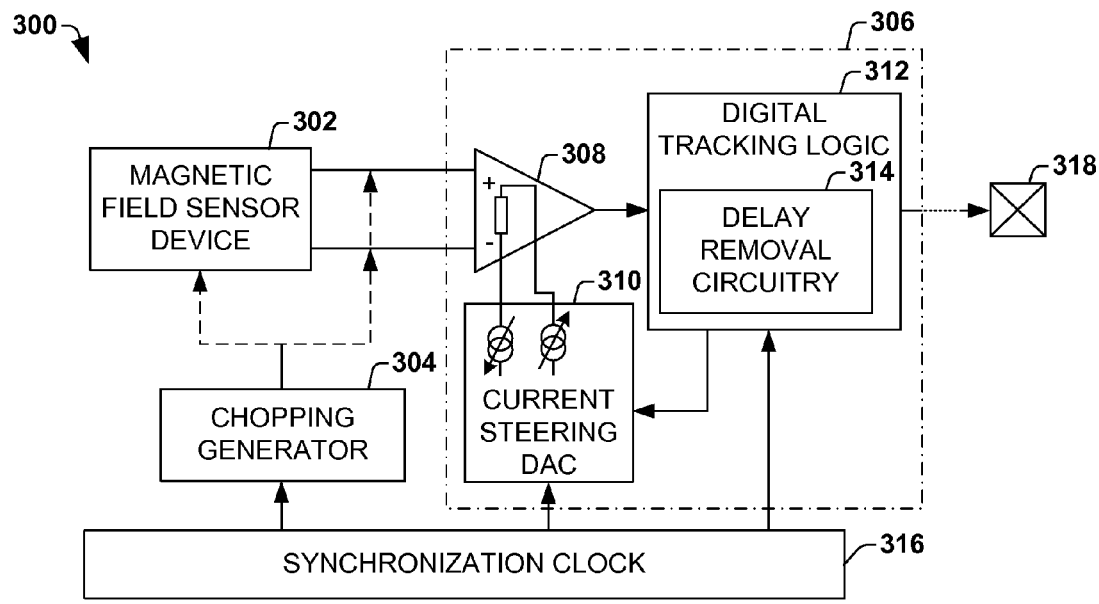
FIG. 3 illustrates a block diagram of a magnetic sensor circuit, showing a more detailed embodiment of exemplary digital signal processing components.

FIG. 3 illustrates a block diagram of a magnetic sensor circuit 300, illustrating a more detailed embodiment of exemplary digital signal processing components. As shown in FIG. 3, the digital signal processing may be performed by digital signal processing components 306, comprising a comparator 308, a current steering digital-to-analog converter (DAC) 310, and a digital tracking logic 312 having delay removal circuitry 314.

In one embodiment, the comparator 308 may comprise a sense resistor. The current steering DAC 310, having one or more current sources, may be configured to generate an input voltage differential across the sense resistor of the comparator 308 so that a buffered sense voltage provided by the magnetic field sensor 302 can be compensated by a current provided by the current steering DAC 310 (e.g., since I*R=V). Therefore, the input voltage provided by the magnetic field sensor 302 is copied to the sense resistor of the comparator 308 and at the same time the current steering DAC 310 overlays the input signal with the opposite signal so that the signal at the end of the tracking algorithm is compensated.

In one embodiment, the digital tracking logic 312 may comprise one or more up/down counters. In such an embodiment, the one or more up/down counters may be configured to receive a digital comparator signal, from comparator 308, which drives operation of an up/down counter. Based upon the digital comparator signal, the up/down counter will increment or decrement its state, so as to count in a proper direction to track the magnetic signal output from the magnetic field sensor 302 (e.g., in a "count up" mode that increments the digital output signal or in a "count down" mode that decrements the digital output signal).

In one embodiment, the digital tracking logic 312 may comprise a plurality of counters, wherein respective counters are configured to track a digital signal component generated by the delay removal circuitry 314. For example, a first up/down counter may be configured to track a first digital signal component and a second up/down counter may be configured to track a second digital signal. The first and second digital signal components from a same chopping phase may be added to generate a non-delayed offset compensated digital output signal. In one embodiment, up/down counting can be enhanced through the use of adaptive up/down counting (e.g., using multiple steps at high slopes of input signal).

Figure 4:
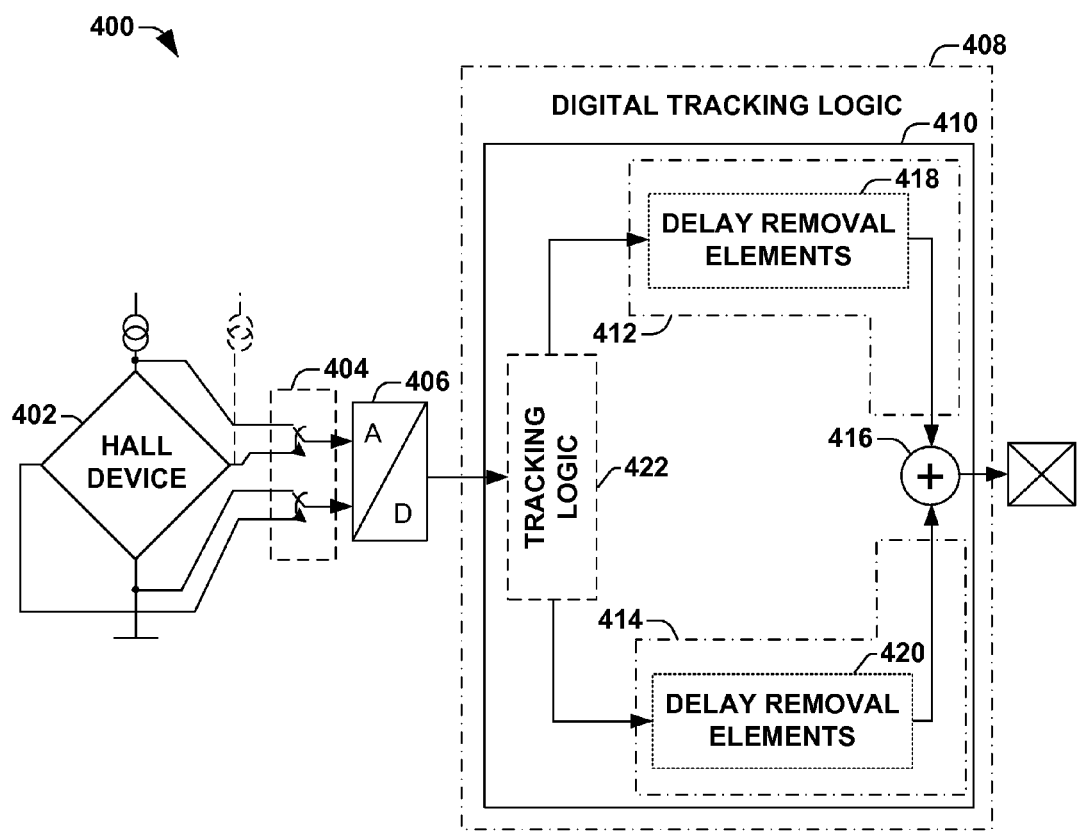
FIG. 4 illustrates a magnetic sensor circuit, showing a more detailed embodiment of delay removal elements.

FIG. 4 illustrates a magnetic sensor circuit 400, illustrating a more detailed embodiment of a delay removal circuitry. As shown in FIG. 4, the delay removal circuitry 410 may comprise first and second signal paths configured to receive a digital signal from an analog-to-digital converter 406, and based thereupon to provide digital signal components corresponding to a chopping phase.

More particularly, magnetic sensor circuit 400 illustrates a chopper generation circuit 404 comprising one or more ADC input chopper switches disposed upstream of an ADC 406 and configured to selectively couple axes of the Hall effect device 402 to the ADC 406 to implement a current spinning method. For example, in the Hall effect device 402 shown in FIG. 4 (configured to operate according to a 90° rotation between clock phases) the ADC input chopper switches are configured to switch the input of the ADC between the outputs of the Hall plate separated by 90° between chopping phases (e.g., during a first chopping phase ADC 406 receives inputs from the 0° and 180° Hall plate outputs, while during a second next chopping phase ADC 406 receives inputs from the 90° and 270° Hall plate outputs).

The digital signal output from the ADC 406 is provided to delay removal circuitry 410 within the digital tracking logic 408. The delay removal circuitry 410 comprises a first signal path 412 and a second signal path 414. The first signal path 412 is configured to provide a first digital signal component to logic element 416, while the second signal path 414 is configured to provide a second digital signal component to logic element 416. In one embodiment, the first signal and second signal paths both comprise one or more delay removal elements, such that the first signal path 412 may comprise one or more delay removal elements 418 that are configured to operate upon the digital signal output from the ADC 406 to generate a first digital signal component corresponding to a chopping phase and the second signal path 414 may comprise one or more delay removal elements 420 that are configured to operate upon the digital signal to generate a second digital signal component corresponding to the chopping phase. In an alternative embodiment, one of the first or second signal paths may comprise one or more delay removal elements while the other signal path does not comprise delay removal elements.

A tracking logic 422 may be configured to operate upon the digital signal output from the ADC 406 and provide a tracked signal to the delay removal elements. In various embodiments, the tracking logic 422 may be comprised upstream of the first and second digital signal paths (as shown in FIG. 4) or may comprise a two separate tracking logic units, respectively comprised within the first and/or second digital signal paths.

Logic element 416 is configured to mathematically operate upon (e.g., add, subtract, etc.) the first and second digital signal components to generate a non-delayed, offset compensated digital output signal, which achieves the value of the analog output signal in a relatively short time (e.g., less than one chopping phase). For example, in one embodiment logic element 416 may subtract the first digital signal component from the second digital signal component in each chopping phase to generate a digital output signal equal to the difference of the digital signal components. The subtraction of the signal components cancels out the offset present in the analog signal, thereby eliminating the effect of unstable offsets (e.g., caused by temperature variations or variations of mechanical stress originated by humidity changes), which are cancelled out.

Although FIG. 4 illustrates delay removal circuitry comprising two signals paths, the invention provided herein is not limited to delay removal circuitry having two signal paths. In alternative embodiments, the delay removal circuitry may comprise a plurality of signal paths (e.g., 3, 4, etc.), wherein respective signal paths are configured to provide a distinct digital signal component to a logic element configured to generate a non-delayed, offset compensated digital output signal.

Figure 5A:
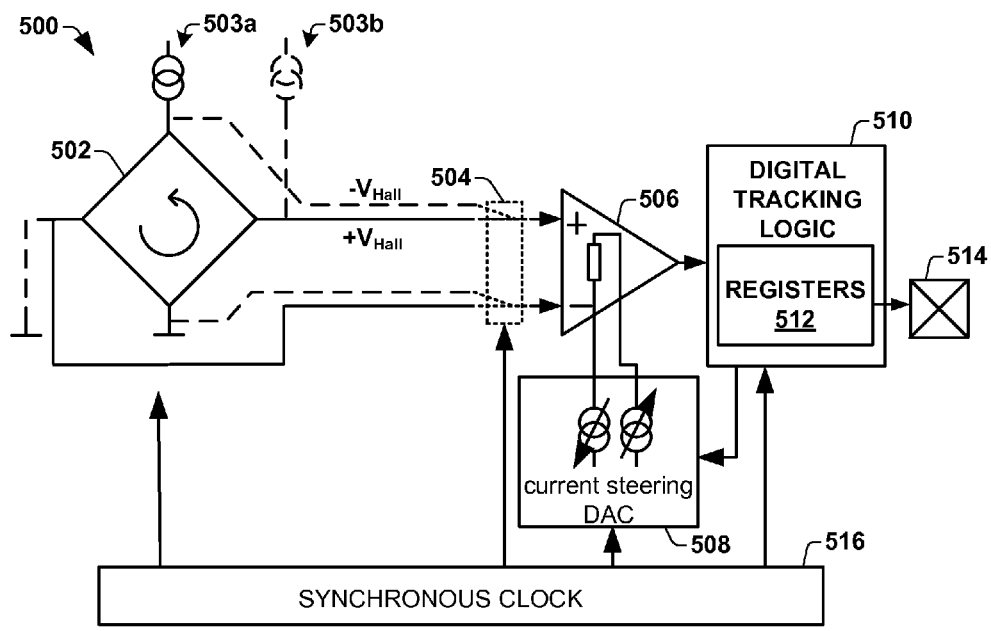
FIG. 5a illustrates a more particular embodiment of a magnetic sensor circuit, having delay removal elements comprising a plurality of registers.
Figure 5B:
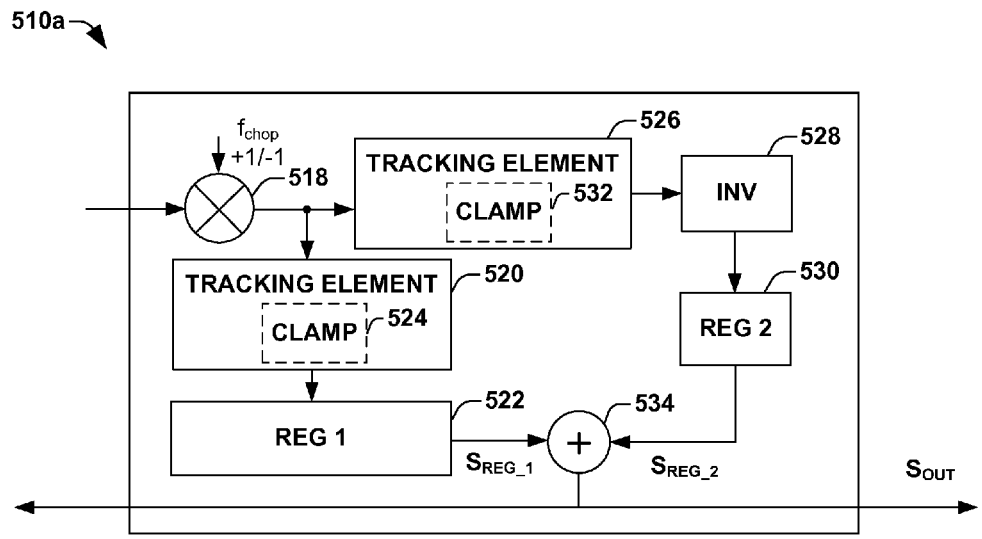
Figure 5C:
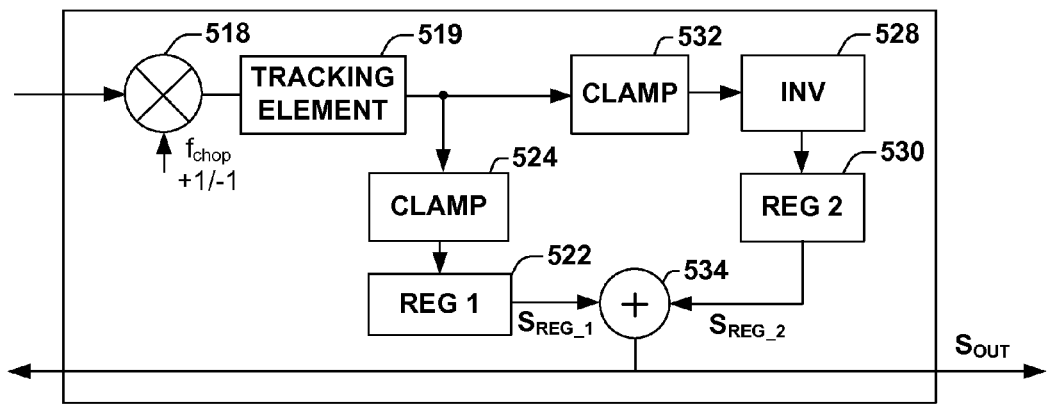

FIGS. 5a-5c illustrates a more particular embodiment of a magnetic sensor circuit 500, comprising a delay removal circuitry comprising a plurality of registers.

As illustrated in FIG. 5a, the magnetic sensor circuit 500 having a magnetic sensor device 502 comprising a spinning Hall plate. The spinning Hall plate outputs an analog signal (e.g., a Hall voltage) to a chopping generation circuit 504, which generates a chopped analog signal that is provided to an ADC converter (comprising elements 506 and 508). The ADC converter is configured to convert the received analog signal to a digital signal that is provided to digital tracking logic 510.

The digital tracking logic 510 comprises a delay removal circuitry comprising a plurality of registers 512 (e.g., 2, 4, or 8 registers for 4 spinning phases) that are respectively configured to store digital signal data corresponding to a tracked digital signal generated by the digital tracking logic 510 for each chopping phase. By summing or difference building of digital signal data stored in the plurality of registers 512, for each chopping phase, a digital output signal may be constructed in a manner that cancels an offset present in the analog signal without introducing a chopper delay (e.g., as shown in FIG. 1b).

During operation of the magnetic sensor circuit 500, the plurality of registers 512 may be updated at each chopping phase (wherein the chopping phase may be defined by the synchronization clock 516). This allows for the register circuitry to continually generate a digital output signal, from the data stored in the plurality of registers, for each chopping phase. In various embodiments, the plurality of registers 512 may be updated by successive approximation (e.g., the ADC finds the signal by starting with the most-significant bit and finishing at the least-significant bit), step-by-step tracking, adaptive tracking (e.g., the ADC is configured to track in n-th step increments, wherein n=2, 4, 8, etc), etc.

In one embodiment, the plurality of registers 512 may comprise a master register and one or more slave registers. The master register is configured to store a first digital signal component comprising a first version of the digital tracked signal, while the slave registers are configured to store one or more versions of the digital tracked signal that are modified with respect to the first digital signal component. The output of the master and slave registers can be mathematically operated upon to generate a non-delayed, offset compensated digital output signal.

FIG. 5b illustrates a more detailed embodiment of a digital tracking logic 510a having delay removal circuitry comprising a plurality of registers 512, as shown in the magnetic sensor circuit of FIG. 5a. As illustrated in FIG. 5b, a chopped digital signal is demodulated by a digital chopping modulator 518 (e.g., configured to alternatively multiple the chopped digital signal by a positive and negative value). The demodulated digital signal is then provided to a first and a second signal path, respectively configured to generate first and second digital signal components.

The first signal path comprises a first tracking element 520 and a first register 522. The first tracking element 520 is configured to track the digital signal while the first register is configured to store the tracked digital signal. The first tracking element 520 further comprises a first clamping element 524 configured to selectively clamp tracking of the digital signal during one or more clock periods (e.g., a first clock period) of selective chopping phases. For example, the clamping element 524 may cause the digital signal component stored in the first register 522 to not track the digital signal in a first clock period of selective chopping phases (e.g., the first register 522 may selectively store a tracked first digital signal component except the first clock period), but to track the digital signal in subsequent clock periods in the selective chopping phases.

The second signal path comprises a second tracking element 526, an inverter 528, and a second register 530. The second tracking element 526 is configured to track the digital signal in the same way as the first tracking element 520. The inverter 528 inverts the amplitude of the tracked digital signal (i.e., changes the polarity of the digital signal to have an opposite amplitude), before it is provided to the second register, which is configured to store the tracked digital signal. The second tracking element 526 further comprises a clamping element 532 configured to selectively clamp tracking of the digital signal at one or more clock periods (e.g., a first clock period) of selective chopping phases. For example, the clamping element 532 may cause the inverted digital signal component stored in the second register 530 to not track the digital signal in a first clock period of in selective chopping phases, but to track the digital signal in subsequent clock cycles of in the selective chopping phases.

During different chopping phases the first and second registers may change between a master register functionality, in which the register stores a non-clamped digital signal, to a slave register functionality, in which the register stores a clamped digital signal (e.g., a digital signal having one or more clock periods clamped). For example, in a first chopping phase the first register 522 may operate as a master register (e.g., clamping element 524 does not clamp the tracked digital signal) and the second register 530 may operate as a slave register (e.g., clamping element 532 does clamp the tracked digital signal), while in a second chopping phase the first register 522 may operate as a slave register (e.g., clamping element 524 does clamp the tracked digital signal) and the second register 530 may operate as a master register (e.g., clamping element 532 does clamp the tracked digital signal). In one embodiment, the selective clamping of slave registers over multiple chopping phases allows for a slowly changing difference generated between master and slave registers to cancel a slowly changing offset.

In yet another embodiment, the first and/or second clamping elements can be activated or deactivated dependant upon digital signal activity. For example, clamping may be deactivated if the slope of the tracked digital signal is large and activated if the slope of the tracked digital signal is small.

A logic element 534 is configured to mathematically operate upon digital signal components stored in the first register and the second register. For example, by summing or difference building of the digital signals stored in the first and second registers, the logic element 534 generates a digital output signal, which is output from the digital tracking logic 510a, having a value of twice the analog signal value, but with offset cancelled and without chopper delay.

FIG. 5c illustrates an alternative embodiment of the digital tracking logic 510b having a single tracking element 519 that provides a digital tracked signal to clamping elements 524 and 532 located within each signal path. The design of digital tracking logic 510b allows for a reduction in the hardware of the system since a single tracking element is used.

Figure 5D:
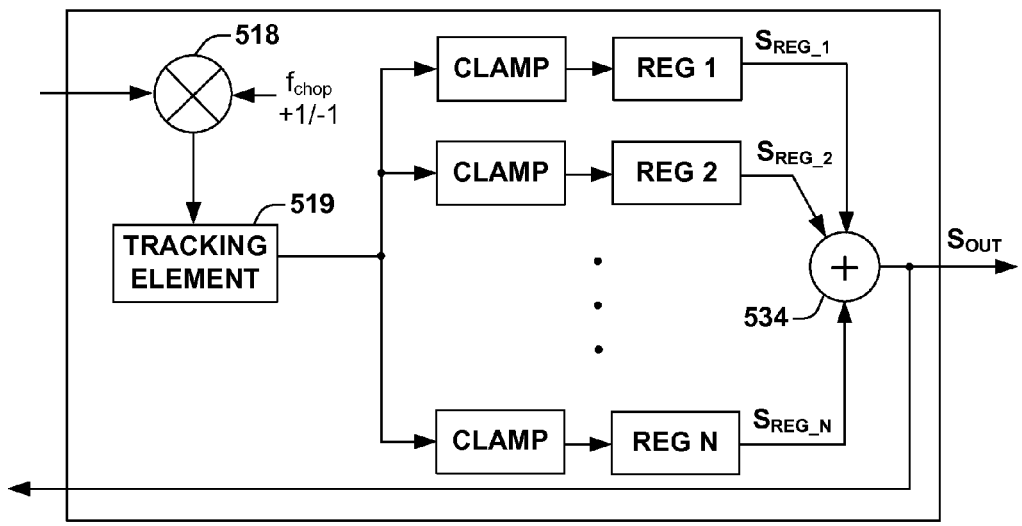

FIG. 5d illustrates yet another alternative embodiment of the digital tracking logic 510c having a plurality of N signal paths, where N=1, 2, 3, 4, etc. As shown in FIG. 5d the digital tracking logic 510c comprises a single tracking element 519 that provides a digital tracked signal to a plurality of N signal paths, wherein each signal path comprises a clamping element and a register. The register in each signal path may be configured to store a single digital signal component corresponding to a chopping phase.

A logic element 534 is configured to receive digital signal components, from the digital signal paths corresponding to a specific chopping phase, to generate the non-delayed, offset compensated digitally tracked output. For example, a first digital signal component (e.g., $S_{REG\_1}$) is provided by one of the plurality of registers acting as a master register storing an undelayed digital signal component (e.g., having a tracked digital signal that was not clamped during the specific chopping phase) and the second digital signal component (e.g., $S_{REG\_2}$) is provided by one of the plurality of registers acting as a slave register storing a delayed digital signal component (e.g., having a tracked digital signal that was clamped for one or more clock periods of the specific chopping phase).

In two specific embodiments, the digital tracking logic 510c may comprise N=4 and N=8 signal paths (i.e., have 4 or 8 registers). In one embodiment, for a digital tracking logic comprising four (4) registers, each register may be configured to store a tracked digital signal corresponding to one of four (4) spinning phases (wherein a spinning phase correspond to a direction in which current is passed along a Hall plate during current spinning). In one embodiment, for a digital tracking logic comprising eight (8) registers each of the eight (8) registers may be configured to store a tracked digital signal corresponding to one of four (4) spinning phases having a first chopping phase polarity (e.g., +1) and one of four (4) spinning phases having a second chopping phase polarity (e.g., −1; generated with a cross-coupled input stage of comparator).

In such embodiments, the system comprises a single register operating with a master register functionality and with one or more of the remainder of registers operating with slave register functionality. For example, in one embodiment wherein the digital tracking logic comprises four (4) signal paths, during a single chopping phase one of the registers may operate as a master register, while one or more of the three other registers may operate as a slave register.

Figure 5E:
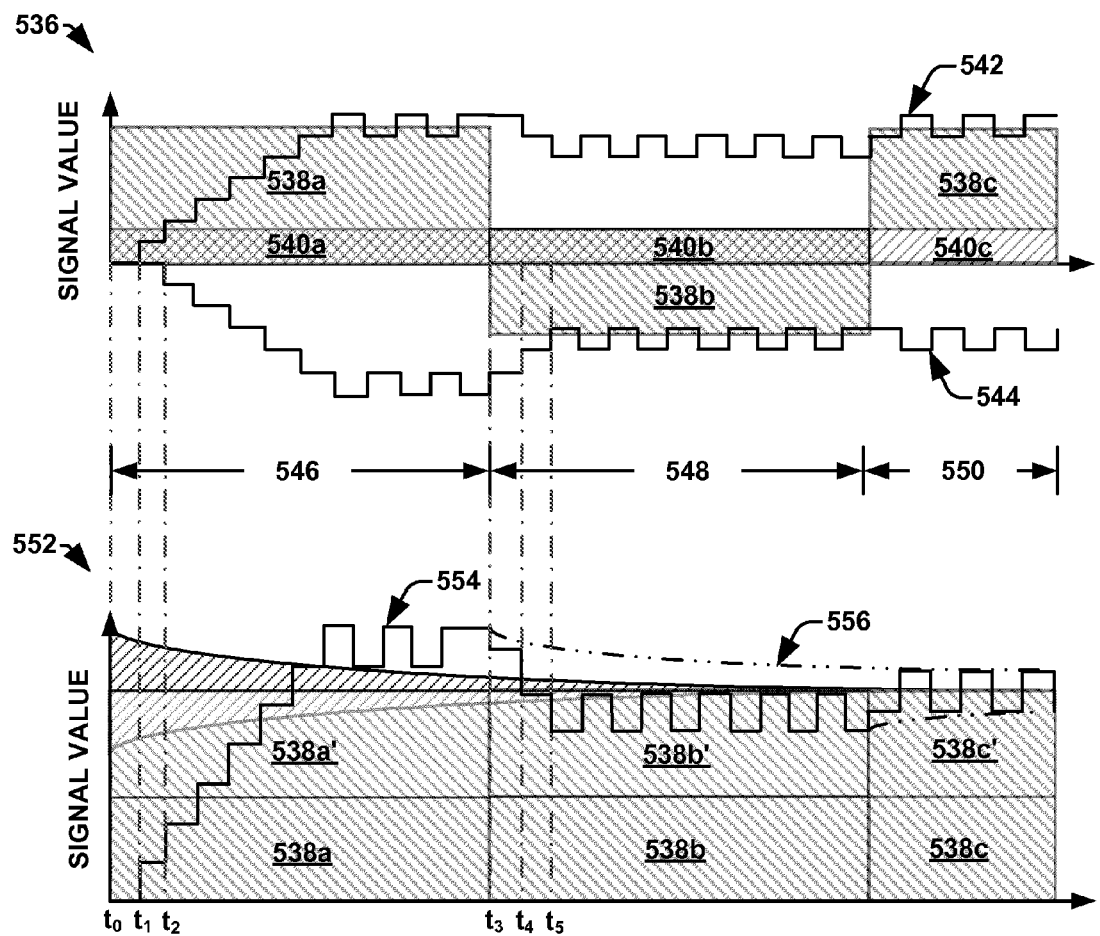
FIG. 5e illustrates signal diagrams corresponding to the magnetic sensor circuit shown in FIG. 5b.

FIG. 5e illustrates signal diagrams corresponding to the magnetic sensor circuit shown in FIG. 5b. Graph 536 illustrates a non-limiting embodiment wherein digital signals stored in the master and slave registers have an opposite polarity. As shown in graph 536, in a first chopping phase 546, a digital signal 542 (comprising a positive base signal component 538a and a positive offset component 540a), which is stored in the first register 522, which is acting as a master register that begins tracking the analog signal from a time $t_0$. A digital signal 544, which is stored in a second register 530, acts as a slave register and is therefore clamped for the first clock period (e.g., from time $t_0$ to time $t_1$) before beginning tracking the analog signal at a time $t_1$. Therefore, tracking of digital signal 544 is delayed by one clock cycle with respect to digital signal 542 (e.g., digital signal 542 undergoes seven continuous "steps" in the first chopping phase while digital signal undergoes six continuous "steps" in the first chopping phase) in the first chopping phase. Accordingly, as shown in graph 536, during the first chopping phase the absolute value of the magnitude of digital signal 542 is greater than the absolute value of the magnitude of digital signal 544, since digital signal 544 follows digital signal 542 except for the first clock period of the first chopping phase 546.

During the second chopper phase 548, digital signal 544 (comprising a negative base signal component and a positive offset signal component), which is stored in the second register 530, acts as a master registers that begins tracking an opposite value of the analog signal from time $t_3$. Digital signal 542, which is stored in the first register 522, acts as a slave register and is therefore is clamped for a clock period (from $t_3$ to $t_4$) before beginning tracking the analog signal from a time $t_4$. Therefore, tracking of digital signal 542 is delayed by one clock cycle with respect to digital signal 544 (e.g., digital signal 544 undergoes one additional "step" in the second chopping phase than digital signal 542) in the second chopping phase. Accordingly, as shown in graph 536, the absolute value of the magnitude of digital signal 542 is greater than the absolute value of the magnitude of digital signal 544, since digital signal 542 is clamped during the first clock period of the second chopping phase 548.

The addition of digital signals 542 and 544 results in a digital output signal 554, as illustrated in graph 552. The tracking delay by a clock period of each chopping phase removes the offset from the digital output signal 554. Furthermore, because the digital output signal 554 is generated from stored digital values corresponding to each chopping phase, the digital output signal 554 has a digital offset that is substantially removed without a long delay time.

In the case that an offset remains during the first chopping phase, the offset decays during subsequent chopper phases by a "bending" of the first tracking update of the slave registers, as illustrated in digital signal 544 between the second and third chopping phases 548 and 550. This bending allows a slow change of a difference between the (opposite) register values and thus an offset update. For example, as illustrated in FIG. 5e, the offset present in the first chopping phase 546 continue to decrease during subsequent chopping phases, resulting in a slow decaying chopper offset ripple 556 that decays with time. The slow decaying chopper offset ripple 556 is made possible (over a long time period), because of the manner in which the clamping (or delay) is introduced for slave registers.

Figure 6A:
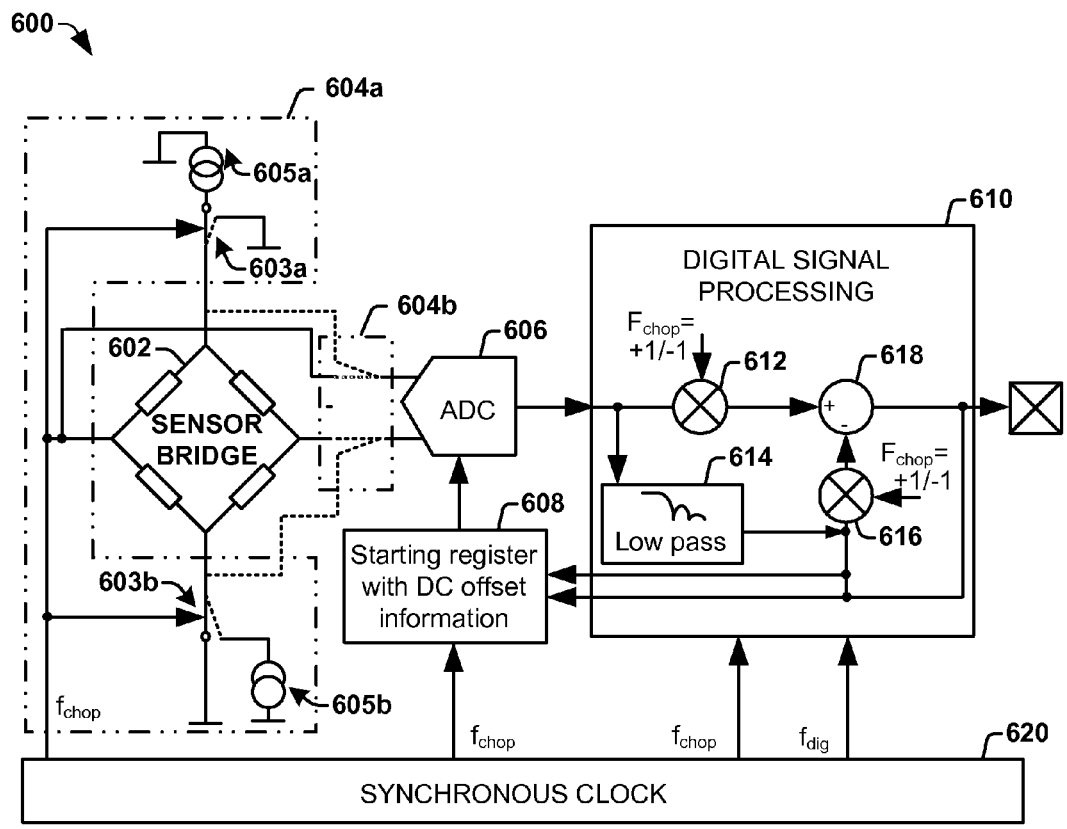
FIG. 6a illustrates an alternative embodiment of a magnetic sensor circuit, having a delay removal element comprising a digital low pass filter.

FIG. 6a illustrates an alternative embodiment of a magnetic sensor circuit 600, having a delay removal circuitry comprising a digital low pass filter. The digital low pass filter is configured within a second signal path that is configured to generate a modulated offset component. The modulated offset component output from the second signal path is overlaid with a demodulated signal, provided by a first signal path to generate a non-delayed, offset compensated digital output signal.

In particular, the magnetic sensor circuit 600 comprises a chopping generation circuit 604 comprising one or more current inversion switches 603, respectively coupled to a DC current source. The plurality of switches may be selectively operated to periodically provide inversion of the sensor bias current applied to the magnetic sensor device in a manner that "chops" (i.e., periodically alternates) the polarity of the analog signal output from the magnetic field sensor device 602. For example, current inversion switches 603a and 603b may be configured to either provide a positive current (traveling from current source 605a to current sink 605b) across the magnetic field sensor device 602 to generate a first analog output signal, or current inversion switches 603a and 603b may be configured to provide a negative current (traveling from current source 605b to current sink 605a) across the magnetic field sensor device 602 to generate a second analog output signal, having a polarity opposite the first analog output signal.

In one embodiment, the ADC chopper switches 604b, are connected in the same way for both current directions generated by current inversion switches 603, but the ADC chopper switches are switched off at the end of each spinning phase to compensate for unsymmetrical charge injection. Therefore, the selective operation of the ADC chopper switches may avoid residual offset by unsymmetrical charge injection (usually caused by mismatch and unsymmetrical clock lines). It will be appreciated that the chopping generation circuits of FIGS. 5a and 6a are interchangeable and that either may be used for a magnetic sensor circuit as provided herein.

The output of the chopping generation circuit 604 is provided to an ADC 606. In one embodiment, the ADC 606 may be configured to receive the DC offset information, determined by the digital signal processing unit 610, from a register 608. The offset information may be successively applied to the ADC (e.g., in a next operating phase to cancel the offset of the magnetic sensor). The reuse of a calculated offset value can provide offset compensation without having to perform offset compensation techniques, thereby reducing or removing the offset to provide for faster acquisition of the signal and resulting in a saving of time and energy.

The digital signal processing unit 610 comprises two signals paths. The first signal path comprises a first digital chopping modulator 612, which is configured to invert the output signal of the ADC by multiplying the output signal by a signal that switches between a positive and negative value at a chopping frequency (e.g., in a first chopping phase the value of the signal $f_{chop}$ is +1, in a second chopping phase the value of the signal $f_{chop}$ is −1, etc.). The modulation switch therefore demodulates a chopped AC signal output from ADC 606 to generate a demodulated signal, having a low frequency base component (e.g., comprising a frequency that is much lower than the chopper frequency/digital clock (ADC) frequency) overlaid with a high frequency AC-offset component (e.g., a low frequency signal having a positive base value, with an offset value that alternates between a positive offset negative offset at a high chopping frequency).

The second signal path comprises a low pass filter 614 and a second digital chopping modulator 616. The low pass filter 614 is configured to filter the output signal of the ADC to generate a signal having a low frequency offset. The second digital chopping modulator 616 is configured to modulate the filtered low frequency offset signal to generate a signal having a high frequency modulated AC-offset component. A logic element 618 is configured to mathematically operate on digital signal components from the first and second signal paths. Summing the digital signal output from the first signal path (having low frequency base component overlaid with an high frequency AC-offset component) with the digital signal output from the second signal path (having a high frequency modulated AC-offset component) results in a non-delayed, offset compensated digital output signal.

Figure 6B:
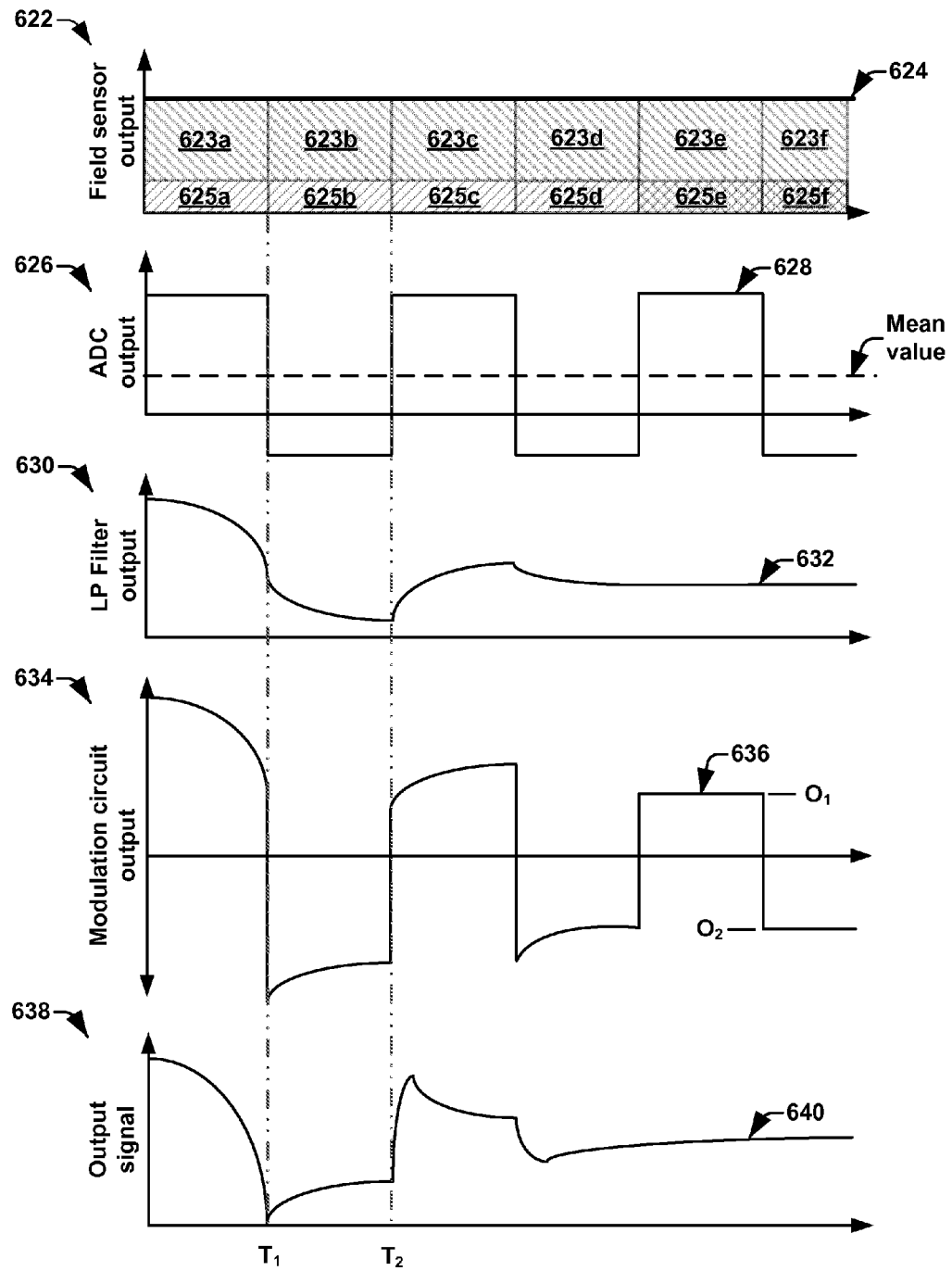

FIG. 6b illustrates signal diagrams corresponding to the magnetic sensor circuit of FIG. 6a. Graph 622 illustrates an exemplary analog signal 624 output from the magnetic sensor element, comprising a base signal component 623 and an offset component 625. As illustrated in FIG. 6b, the signal components in different chopping phases are denoted by the suffix a, b, c, etc.

Graph 626 illustrates an exemplary digital signal output from ADC 606. As shown, the digital signal 628 comprises an AC signal that is overlaid with a low frequency offset (e.g., substantially DC offset). The low frequency offset causes the chopped digital signal 628 to have a mean value that is shifted away from a value of 0 by an amount equal to the value of the low frequency offset. The digital signal 628 varies from a positive signal value to a negative signal value in the different chopping phases. For example, in the first chopping phase, from time $T_0$ to time $T_1$, the chopped digital signal 628 is positive, while in the second chopping phase, from time $T_1$ to time $T_2$, the chopped digital signal 628 is negative. It will be appreciated that the positive values may be provided by a chopping generation circuit or by master or slave registers, in various embodiments.

Graph 630 illustrates an exemplary filtered digital signal 632 output from the low pass filter 614 in the second digital signal path. The filtered signal 632 illustrates the cancellation of the AC signal component in the chopped digital signal 628, so that the output of the low pass filter settles over time (e.g., after time $T_3$) as a signal comprising a low frequency offset value (i.e., a signal comprising a positive offset value and substantially no base signal component).

Graph 634 illustrates an exemplary signal 636 output from the second digital chopping modulator 616. The signal 636 comprises an offset component that is modulated to have a value that alternates between a positive value $O_1$ and a negative value $O_2$. In particular, the signal 636 is generated by multiplying signal 632 by a signal that switches between a positive and negative value at a chopping frequency (e.g., in a first chopping phase the value of the signal $f_{chop}$ is +1, in a second chopping phase the value of the signal $f_{chop}$ is −1, etc.).

Figure 7:
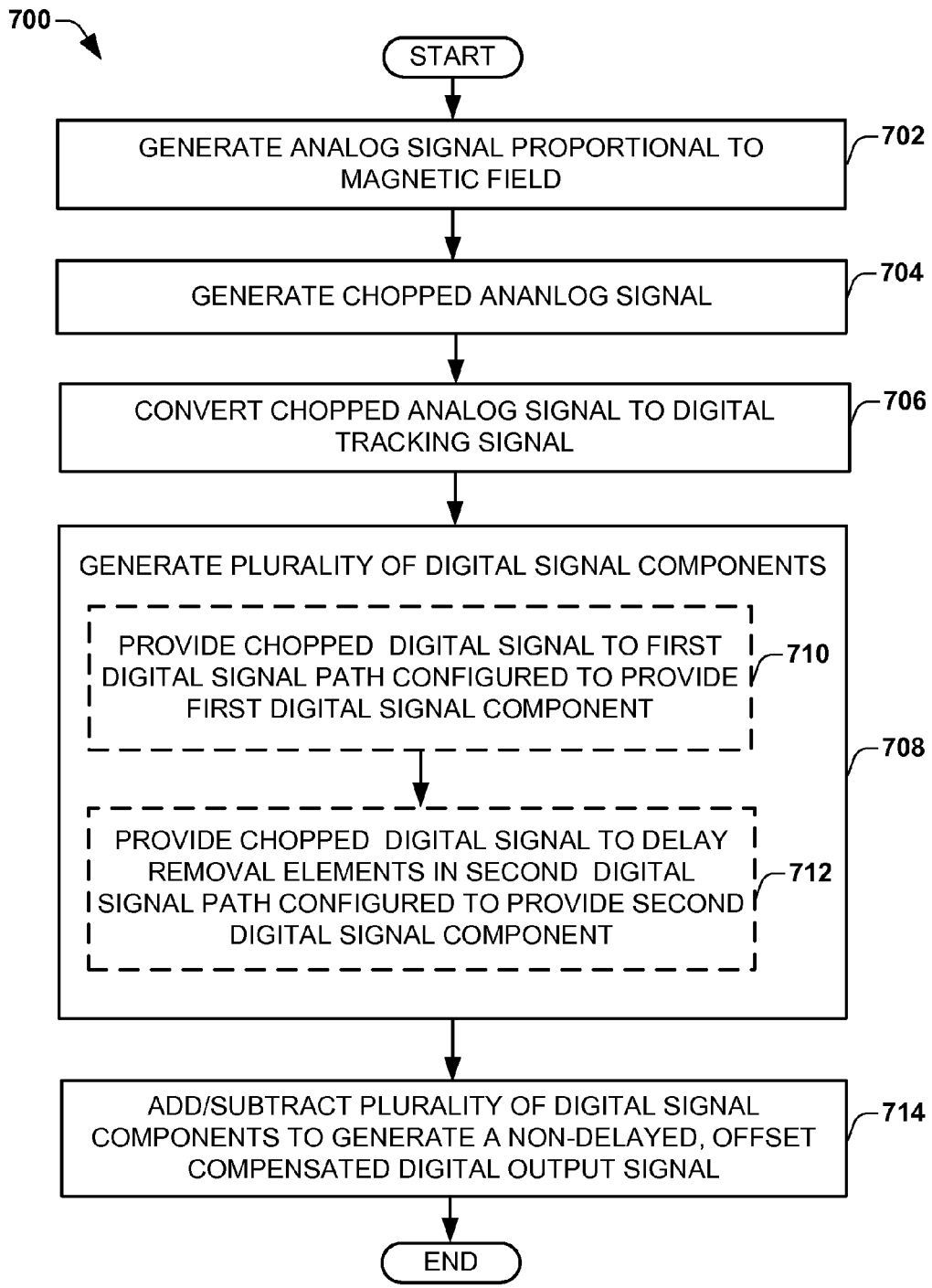
FIG. 7 is a flow diagram illustrating a method for digitally tracking a magnetic field sensor output signal in a manner that generates a non-delayed, offset compensated digital output signal.

Graph 638 illustrates an exemplary signal 640 output from logic element 618. The signal 640 has an offset cancelled and is achieved without chopper delay. The signal is generated by subtracting the signal from the second path, comprising an high frequency AC offset component, from the signal in the first path, comprising a low frequency base component and a high frequency AC offset component, to generate FIG. 7 illustrates a flow diagram of an exemplary method 700 for digitally tracking a magnetic field sensor output signal in a manner that generates a non-delayed, offset compensated digital output signal.

While method 700 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

At 702 an analog signal proportional to a detected applied magnetic field is generated. In various embodiments, the analog signal may be generated by a magnetic field sensor device comprising a Hall effect magnetic field sensor, an anisotropic magnetoresistance (AMR) magnetic field sensor, a giant magnetoresistance (GMR) magnetic field sensors, etc., for example At 704 the analog signal is chopped. Chopping the analog signal comprises the polarity of analog signals output from a magnetic sensor device can be periodically switched in time (e.g., switched during different chopping phases), in a manner that changes the polarity of the analog signal without changing the polarity of the offset, to generate a chopped signal.

A chopped analog signal is converted to a tracked digital signal at 706.

At 708 a plurality of digital signal components are generated from the tracked digital signal within a chopping phase. For example, in one embodiment a first digital signal component may comprise the tracked digital signal corresponding to a first chopping phase, while the second digital signal component may comprise a tracked digital signal, modified with respect to the first digital signal component and corresponding to the first chopping phase.

The plurality of digital signal components may be provided by a plurality of signal paths, wherein respective signal paths are configured to provide a digital signal component within each chopping phase of a magnetic sensor device at 708. For example, in one embodiment the chopped digital signal is received by a first digital signal path (step 710), configured to provide a first digital signal component within a chopping phase, and by a second digital signal path (step 712) having one or more delay removal elements and configured to provide a second digital signal component within the chopping phase. In one embodiment the first digital signal path may also comprise one or more delay removal elements.

It will be appreciated that the delay removal elements may comprise a variety of components. In one embodiment, delay removal elements in the first digital signal path may comprise a first register while delay removal elements in the second digital signal path may comprise a second register, as described above in relation to FIGS. 5a-5c. In another embodiment, the delay removal elements in the second digital signal path may comprise low pass filter, as described above in relation to FIGS. 6a-6b.

At 714 the plurality of digital signal components can be mathematically operated upon (e.g., added, subtracted) to generate a non-delayed, offset compensated digital output signal.

The inventor has appreciated that difference building, as provided herein, is meant to encompass alternative processes which perform the same general process of offset cancellation, but which vary the process (e.g., to a summation process) by changing one or more signal polarities. For example, in one embodiment, instead of difference building through the switches generating a positive difference between the positive Hall voltage and negative Hall voltage in a chopping phase, switches may be configured to generate offsets having opposite polarities in a chopping phases (e.g., to be positive and negative), so that summing (rather than difference building) is used to cancel the offsets.

Although the invention has been illustrated and described with respect to one or more implementations, alterations and/or modifications may be made to the illustrated examples without departing from the spirit and scope of the appended claims. For example, although the invention has been described herein with respect to soft errors, one of ordinary skill in the art will appreciate that the method and apparatus provided herein may also be applied to permanent memory errors. Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A magnetic sensor circuit, comprising:
a magnetic field sensor device configured to generate an analog signal proportional to an applied magnetic field;
a chopping generation circuit configured to periodically switch a polarity of the analog signal to generate a chopped signal having different polarities in temporally adjacent chopping phases;
an analog-to-digital converter (ADC) configured to convert the chopped signal to a digital signal; and
a digital signal processing unit configured to digitally track the analog signal, the digital signal processing unit comprising a delay removal circuitry configured to generate a plurality of digital signal components from a same chopping phase based upon the tracked digital signal, and to mathematically operate upon the plurality of digital signal components from the same chopping phase to generate a non-delayed, offset compensated digital output signal within the same chopping phase.

2. The magnetic sensor circuit of claim 1, wherein the delay removal circuitry comprises:
a logic element;
a first signal path configured to provide a first digital signal component corresponding to the same chopping phase from the ADC to the logic element;
a second signal path comprising one or more delay removal elements configured to operate upon the digital signal to provide a second digital signal component corresponding to the chopping phase from the ADC to the logic element; and
wherein the logic element is configured to add or subtract the first and second digital signal components to generate the non-delayed, offset compensated digital output signal.

3. The magnetic sensor circuit of claim 2,
wherein the first signal path comprises one or more delay removal elements comprising a first register configured to store the first digital signal component comprising the tracked digital signal, and
wherein the one or more delay removal elements in the second signal path comprise a second register configured to store the second digital signal component comprising the tracked digital signal.

4. The magnetic sensor circuit of claim 3, wherein the delay removal circuitry comprises additional signal paths, respectively additional signal paths comprising an additional register configured to store additional digital signal components.

5. The magnetic sensor circuit of claim 3, wherein the one or more delay removal elements in the first signal path further comprise a first clamping element and the one or more delay removal elements in the second signal path further comprise a second clamping element, the first and second clamping elements configured to selectively stop tracking of the digital signal at one or more clock periods within selective chopping phases.

6. The magnetic sensor circuit of claim 5,
wherein during a first chopping phase the first clamping element is configured to stop tracking of the first digital signal component stored in the first register for one or more clock periods, and
wherein during an immediately subsequent second chopping phase the second clamping element is configured to clamp tracking of the second digital signal component stored in the second register for one or more first clock periods.

7. The magnetic sensor circuit of claim 2, wherein the chopping generation circuit configured to modulate a base component of the analog signal without modulating an offset component of the analog signal, thereby causing the digital signal to comprise a high frequency modulated base component and a low frequency offset component.

8. The magnetic sensor circuit of claim 7,
wherein the first signal path comprises a first digital chopping modulator configured to demodulate the digital signal and to provide a first digital signal component having a low frequency base component and a high frequency modulated offset component;
wherein the second signal path comprises:
a low pass filter configured to low pass filter the digital signal to generate a signal having a base component with substantially zero amplitude and a low frequency offset component; and
a second digital chopping modulator configured to modulate the low frequency offset component to generate a second digital signal component having a high frequency modulated offset component.

9. The magnetic sensor circuit of claim 7, wherein the chopping generation circuit comprises one or more ADC input chopper switches disposed upstream of the digital signal processing unit and configured to selectively couple axes of the magnetic field sensor to the digital signal processing unit at a chopping frequency.

10. The magnetic sensor circuit of claim 9, wherein the ADC input chopper switches are connected in a same way when alternating the polarity of the analog signal, but the ADC input chopper switches are disconnected at the end of each spinning phase to compensate unsymmetrical charge injection.

11. The magnetic sensor circuit of claim 7,
wherein the chopping generation circuit comprises a plurality of current inverting switches, respectively coupled to a DC current source, and
wherein the plurality of current inverting switches are selectively operated to periodically provide inversion of a sensor bias current applied to the magnetic sensor device in a manner that periodically alternates a polarity of the analog signal output from the magnetic sensor device.

12. A method for digitally tracking an analog signal output from a magnetic field sensor device, comprising:
generating an analog signal proportional to an applied magnetic field that is detected by the magnetic field sensor device;
periodically switching a polarity of the analog signal to generate a chopped signal having different polarities in temporally adjacent chopping phases;
generating a tracked digital signal that tracks the chopped signal;
generating a plurality of digital signal components based upon the tracked digital signal, wherein two or more of the plurality of digital signal components correspond to a same chopping phase; and
mathematically operating upon the two or more of the plurality of digital signal components from the same chopping phase to generate a non-delayed, offset compensated digital output signal within the same chopping phase.

13. The method of claim 12, wherein generating a plurality of digital signal components comprises:
providing the tracked digital signal to a first signal path configured to provide a first digital signal component; and
providing the tracked digital signal to a second signal path comprising one or more delay removal elements configured to operate upon the digital tracked signal to provide a second digital signal component.

14. The method of claim 13,
wherein the first signal path comprises one or more delay removal elements comprising a first register configured to store the first digital signal component comprising the tracked digital signal, and
wherein the one or more delay removal elements in the second signal path comprise a second register configured to store the second digital signal component comprising the tracked digital signal.

15. The method of claim 14,
wherein during a first chopping phase, tracking of the first digital signal component stored in the first register is clamped for one or more clock periods of the first chopping phase, and
wherein during an immediately subsequent second chopping phase, the tracking of the second digital signal component stored in the second register is clamped for one or more clock periods of the second chopping phase.

16. The method of claim 13,
wherein the first signal path comprises a first digital chopping modulator configured to demodulate the digital signal and to provide a first digital signal component having a low frequency base component and a high frequency modulated offset component;
wherein the second signal path comprises:
a low pass filter configured to low pass filter the digital signal to generate a signal having a base component with substantially zero amplitude and a low frequency offset component; and
a second digital chopping modulator configured to modulate the low frequency offset component to generate a second digital signal component having a high frequency modulated offset component.

17. A magnetic sensor circuit, comprising:
a magnetic field sensor device configured to generate an analog output signal proportional to an applied magnetic field;
a chopping generation circuit coupled to an output of the magnetic field sensor and configured to generate a chopped signal by periodically vary the polarity of components of the analog signal;
a digital tracking unit coupled to an output of the chopping generation circuit, the digital tracking unit comprising:
a plurality of registers, respective registers configured to store a digital signal component corresponding to a chopping phase; and
a logic element configured to add or subtract first and second digital signal components corresponding to a specific chopping phase to generate a non-delayed, offset compensated digital output signal, wherein the first digital signal component is provided by one of the plurality of registers acting as a master register that stores an undelayed digital signal component and the second digital signal component is provided by one of the plurality of registers acting as a slave register that stores a delayed digital signal component.

18. The circuit of claim 17, wherein the first and second digital signal components comprise an opposite amplitude.

19. The circuit of claim 17, further comprising:
a plurality of clamping elements, respective clamping elements coupled to an input of one of the plurality of registers and configured to selectively stop tracking of the digital signal stored in the register at one or more clock periods of selective chopping phases.

20. The circuit of claim 17, wherein during a first chopping phase a first clamping element coupled to a slave register is configured to stop tracking of the digital signal component stored in a first register for one or more clock periods, and a second clamping element coupled to a master register is configured to not stop tracking of the digital signal component stored in a second register.

21. A magnetic sensor circuit, comprising:
a magnetic field sensor device configured to generate an analog signal proportional to an applied magnetic field;
an analog-to-digital converter (ADC) configured to convert the analog signal to a digital signal;
a digital signal processing unit configured to digitally track the analog signal, the digital signal processing unit comprising a delay removal circuitry configured to generate a plurality of digital signal components corresponding to a chopping phase based upon the tracked digital signal, and to mathematically operate upon the plurality of digital signal components to generate a non-delayed, offset compensated digital output signal within the chopping phase;
a chopping generation circuit configured to modulate a base component of the analog signal without modulating an offset component of the analog signal, thereby causing the digital signal to comprise a high frequency modulated base component and a low frequency offset component;
wherein the delay removal circuitry comprises:
a first signal path configured to provide a first digital signal component corresponding to the chopping phase;
a second signal path comprising one or more delay removal elements configured to operate upon the digital signal to provide a second digital signal component corresponding to the chopping phase; and a logic element configured to add or subtract the first and second digital signal components to generate the non-delayed, offset compensated digital output signal.

* * * * *